United States Patent [19]
Cooperman

[11] 4,295,089
[45] Oct. 13, 1981

[54] METHODS OF AND APPARATUS FOR GENERATING REFERENCE VOLTAGES

[75] Inventor: Michael Cooperman, Framingham, Mass.

[73] Assignee: GTE Laboratories Incorporated, Waltham, Mass.

[21] Appl. No.: 158,672

[22] Filed: Jun. 12, 1980

[51] Int. Cl.³ .................. H02J 1/00; H03K 13/02
[52] U.S. Cl. .......................... 323/351; 323/313; 340/347 AD
[58] Field of Search .......... 323/265, 271, 282, 283, 323/293, 312, 313, 314, 322, 351, 352, 364; 340/347 AD

[56] References Cited

U.S. PATENT DOCUMENTS

| | | | |
|---|---|---|---|
| 4,077,035 | 2/1978 | Yee | 340/347 AD X |
| 4,129,863 | 12/1978 | Gray et al. | 340/347 AD |
| 4,195,282 | 3/1980 | Cameron | 340/347 AD |
| 4,200,863 | 4/1980 | Hodges et al. | 340/347 AD |

Primary Examiner—William M. Shoop
Attorney, Agent, or Firm—Fred Fisher

[57] ABSTRACT

Methods of and apparatus for generating precise reference voltages in a system utilizing a reference voltage V is disclosed including apparatus having a comparator, a voltage-to-current pulse converter having an input coupled to an output terminal of the comparator, a storage capacitor coupled across the output of the converter, and a point of reference potential, a buffer having an input coupled to the output of the converter, means for applying a reference voltage V to one terminal of a first capacitor while the second terminal of the first capacitor is coupled to a point of reference potential, means for decoupling the second terminal from the point of reference potential while the second terminal of the first capacitor remains coupled to an input terminal of a comparator, and means for applying the output of the buffer to a first terminal of the second capacitor wherein a second terminal of the second capacitor is coupled to the input terminal of the comparator. The first capacitor has capacitance value of $(2^{2n-1}+\ldots+2^1+2^0)$ m farads. The second capacitor has value of $(2^{2n-1}+\ldots+2^n)$ m farads. "n" is a positive integer, and "m" is a positive constant. In another embodiment, in lieu of the converter, storage capacitor, and buffer, a capacitive attenuator/memory and voltage divider is used. The output of the comparator is stored in the memory, and is applied to a voltage divider having an output coupled to the first terminal of the second capacitor.

32 Claims, 4 Drawing Figures

METHODS OF AND APPARATUS FOR GENERATING REFERENCE VOLTAGES

BACKGROUND OF THE INVENTION

1. Field of the Invention

This invention relates to methods of and apparatus for generating reference voltages. Accordingly, it is a general object of this invention to provide new and improved methods and apparatus of such character.

2. Description of the Prior Art

Various electrical apparatus of the prior art utilize a plurality of reference voltages, wherein one reference voltage has a unique relationship to another reference voltage, whether it be a particular fraction of the voltage or a different polarity of such voltage. Such electrical apparatus can include coders, decoders, and can include such charge redistribution circuits as disclosed in U.S. Pat. No. 4,195,282 to Frank L. Cameron, issued Mar. 25, 1980, and assigned to the same assignee as this invention.

As set forth in the aforesaid patent, various reference voltages are used including $V_{REF}$, $V_{REF}/16$, and $-V_R$. A charge redistribution circuit, as set forth in the aforesaid patent, utilizes capacitors and a comparator.

Several elements of the charge redistribution circuit set forth in the foregoing patent, including the comparator and reference voltages, are of special interest. The comparator offset should be small for accurate encoding. An offset correction circuit for differential amplifiers for correction of comparator offset is disclosed in copending United States application Ser. No. 070,192, entitled "Offset Correction Circuit for Differential Amplifiers", filed Aug. 27, 1979, by Michael Cooperman, the applicant herein.

SUMMARY OF THE INVENTION

Another object of this invention is to provide for new and improved methods and apparatus for generating precise reference voltages, especially for the operation of coders and decoders.

Still another object of this invention is to provide for new and improved methods of and apparatus for generating precise reference voltages which require less power, less volume, and which have accuracies in excess of those known to the prior art.

In accordance with one embodiment of this invention, a precise reference voltage having any ratio with respect to V, such as xV, in a system which utilizes a reference voltage V, can be provided by a method as follows: (a) apply the reference voltage V to one side of a first capacitor while the opposite side of that capacitor is coupled to a point of reference potential; (b) with the opposite side of the first capacitor coupled to an input terminal of a comparator, decouple the opposite side of the capacitor from the point of reference potential, permitting such opposite side to float; (c) apply that point of reference potential to that first capacitor one side while that capacitor opposite side remains coupled to the comparator input terminal, convert a voltage output of the comparator to a current pulse and store the current pulse, apply the stored pulse to a buffer to provide a nominal reference voltage xV, apply the nominal reference voltage xV to one side of the second capacitor while the opposite side thereof is coupled to the comparator input terminal; and (d) couple all sides of the capacitors to the point of reference potential and cyclically repeat the foregoing steps. The ratio of the value of the first capacitor to the value of the second capacitor is x.

In accordance with another embodiment of the invention, apparatus for providing a precise reference voltage xV, which utilizes a reference voltage V therewithin, includes the following combination: A first capacitor, having one terminal, has its second terminal coupled to an input terminal of a comparator. The reference voltage V is applied by suitable means to the first capacitor one terminal while the second terminal thereof is coupled to a point of reference potential. The second terminal is decoupled from the point of reference potential by suitable means. A voltage-to-current pulse converter has an input coupled to the comparator output terminal. A storage capacitor is coupled across a point of reference potential and the output of the converter. The output of the converter is coupled to an input of a buffer. A second capacitor, having a first terminal, has a second terminal coupled to the comparator input terminal. The output of the buffer is applied to the first terminal of the second capacitor by suitable means. The ratio of the value of said first capacitor to the value of said second capacitor is x.

In accordance with still yet another embodiment of this invention, a precise reference voltage having any ratio with respect to V, such as xV, in a system which utilizes a reference voltage V, can be provided by a method as follows: (a) apply the reference voltage V to one side of a first capacitor while the opposite side of that capacitor is coupled to a point of reference potential; (b) with the opposite side of the first capacitor coupled to an input terminal of a comparator, decouple the opposite side of the capacitor from the point of reference potential, permitting such opposite side to float; (c) apply that point of reference potential to that first capacitor one side while that capacitor opposite side remains coupled to the comparator input terminal, store an output of the comparator, apply the stored output through a voltage divider to provide a nominal reference voltage xV, apply the nominal reference voltage xV to one side of the second capacitor while the opposite side thereof is coupled to the comparator input terminal; and (d) couple all sides of the capacitors to the point of reference potential and cyclically repeat the foregoing steps. The ratio of the value of the first capacitor to the value of the second capacitor is x.

In accordance with yet another embodiment of the invention, apparatus for providing a precise reference voltage xV, which utilizes a reference voltage V therewithin, includes the following combination: A first capacitor, having one terminal, has its second terminal coupled to an input terminal of a comparator. The reference voltage V is applied by suitable means to the first capacitor one terminal while the second terminal thereof is coupled to a point of reference potential. The second terminal is decoupled from the point of reference potential by suitable means. A capacitive attenuator/memory has an input coupled to the comparator output terminal. A voltage divider, controlled by the capacitive attenuator/memory, has its output applied to the first terminal of a second capacitor by suitable means, a second terminal of the second capacitor being coupled to the comparator input terminal. The ratio of the value of said first capacitor to the value of said second capacitor is x.

In accordance with yet another embodiment of this invention, a precise reference voltage $V/2^n$, in a system which utilizes a reference voltage V, can be provided by a method as follows: (a) apply the reference voltage V to one side of a first capacitor while the opposite side of that capacitor is coupled to a point of reference potential; (b) with the opposite side of the first capacitor coupled to an input terminal of a comparator, decouple the opposite side of the capacitor from the point of reference potential, permitting such opposite side to float; (c) apply that point of reference potential to that first capacitor one side while that capacitor opposite side remains coupled to the comparator input terminal, convert a voltage output of the comparator to a current pulse and store the current pulse, apply the stored pulse to a buffer to provide a nominal reference voltage $V/2^n$, apply the nominal reference voltage $V/2^n$ to one side of the second capacitor while the opposite side thereof is coupled to the comparator input terminal; and (d) couple all sides of the capacitors to the point of reference potential and cyclically repeat the foregoing steps. The first capacitance has a value of $(2^{n-1}+ \ldots +2^1+2^0)$ m farads. The second capacitance has a value of $(2^{2n-1}+ \ldots +2^{n+1}+2^n)$ m farads. "n" is a positive integer, and "m" is a positive constant. In certain features of the invention, the two capacitors can have values of capacitance in a ratio of 15 to 240. The second capacitor can include two parallel capacitive banks having a ratio of 128 to 112.

In accordance with another embodiment of the invention, in a system utilizing a reference voltage $+V$, precise reference voltages $+V/2^n$, $-V/2^n$, and $-V$ can be provided by a method as follows: (a) apply the reference voltage $+V$ to one side of a first capacitor while the opposite side thereof is coupled to a point of reference potential; (b) with the opposite side of the first capacitor coupled to an input terminal of the comparator, decouple such opposite side from the point of reference potential, permitting such side to float; (c) apply the point of reference potential to the one side of the first capacitor while the opposite side thereof remains coupled to the comparator input terminal, convert a voltage output of the comparator to a first current pulse and store same, apply the stored pulse to a first buffer to provide a nominal reference voltage $+V/2^n$, apply the nominal reference voltage $+V/2^n$ to one side of a second capacitor and to one side of a third capacitor while the opposite sides thereof are coupled to the comparator input terminal; (d) couple all sides of all the capacitors to the point of reference potential; (e) with the opposite sides of the capacitors coupled to the input terminal of the comparator, decouple the opposite sides of capacitors from the point of reference potential, permitting the opposite sides to float; (f) apply the reference voltage $+V$ to the one side of the third capacitor while the opposite sides of the capacitors remain coupled to the input terminal of the comparator, convert a voltage output of the comparator to a second current pulse and store the second current pulse, apply the stored second current pulse through a second buffer to provide a nominal reference voltage $-V$, apply the nominal reference voltage $-V$ to the one side of the first capacitor, to the first side of the second capacitor and to one side of the fourth capacitor, an opposite side of the fourth capacitor being coupled to the input terminal of the comparator; (g) couple all sides of all the capacitors to a point of reference potential; (h) with the opposite sides of the capacitors coupled to the comparator input terminal, decouple the opposite sides of the capacitors from the point of reference potential, permitting the opposite sides to float; and (i) apply the reference voltage $+V$ to the one side of the first capacitor while the opposite sides of the capacitor remain coupled to the input terminal of the comparator, convert a voltage output of the comparator to a third current pulse and store the third current pulse, apply the stored third current pulse through a third buffer to provide a nominal reference voltage $-V/2^n$, and apply the nominal reference voltage $-V/2^n$ to the one side of the second capacitor and to the one side of the third capacitor. The one side of the fourth capacitor is coupled to the point of reference potential. The first capacitor has a value of $(2^{n-1}+ \ldots 2^1+2^0)$ m farads. The second capacitor has a value of $(2^{2n-1}+ \ldots 2^{n+1}+2^n)$ m farads. The third capacitor has a value of $2^{2n-1}$ m farads. The fourth capacitor has a value of 1 m farads, "n" being a positive integer, and "m" being a positive constant. In certain features of the invention, the four capacitors have values of capacitance in proportions of 15, 112, 128, and 1, respectively; and "n" can equal four. In certain features, the steps are cyclically repeated: the steps (a), (b), (c), (d), (e), (f), (g), (h), and (i) can be cyclically repeated. In other features, the steps (a), (b), (c), (g), (h), (i), (d), (e), and (f) are performed in repeated sequential order.

In accordance with another embodiment of the invention, apparatus for providing a precise reference voltage $V/2^n$, which utilizes a reference voltage V therewithin, includes the following combination: a first capacitor, having one terminal, has its second terminal coupled to an input terminal of a comparator. The reference voltage V is applied by suitable means to the first capacitor one terminal while the second terminal thereof is coupled to a point of reference potential. The second terminal is decoupled from the point of reference potential by suitable means. A voltage-to-current pulse converter has an input coupled to the comparator output terminal. A storage capacitor is coupled across a point of reference potential and the output of the converter. The output of the converter is coupled to an input of a buffer. A second capacitor, having a first terminal, has a second terminal coupled to the comparator input terminal. The output of the buffer is applied to the first terminal of the second capacitor by suitable means. The first capacitor has a value of $(2^{n-1}+ \ldots +2^1+2^0)$ m farads. The second capacitor has a value of $(2^{2n-1}+ \ldots +2^{n+1}+2^n)$ m farads. "n" is a positive integer, and "m" is a positive constant. In accordance with certain features of the invention, "n" equals four, and the two capacitors have values of capacitance in a ratio of 15 to 240. In other features of the invention, the second capacitor includes two capacitive banks having a ratio of 128 to 112. In accordance with still another feature of the invention, the apparatus can further include a second voltage-to-current pulse converter which has an input coupled to the output terminal of the comparator. A third voltage-to-current pulse converter is provided which has its input coupled to the output terminal of the comparator. A second storage capacitor is coupled across the point of reference potential and the output of the second converter. A third stage capacitor is coupled across the point of reference potential and the output of the third converter. A second buffer has an input coupled to the output of the second converter. A third buffer has an input coupled to the output of the third converter. The output of the second buffer is applied to the first terminal of the first capacitor and to one only of the capacitive banks by suitable means. Further, means are provided for applying the output of the third buffer to the first terminal of the second capacitor. In other features, the first capacitor and the capacitive banks can have values of 15, 112, and 128 m farads, respectively. In other features, a fourth capacitor can be provided having a value of 1 m farads coupled between the input of the comparator and, selectively, either a point of reference potential or a reference voltage $-V$.

BRIEF DESCRIPTION OF THE DRAWING

Other objects, advantages, and features of this invention, together with this construction and mode of operation, will become more apparent from the following description, when read in conjunction with the accompanying drawing, in which.

DESCRIPTION OF KNOWN CHARGE REDISTRIBUTION CIRCUITS

Figure 1:
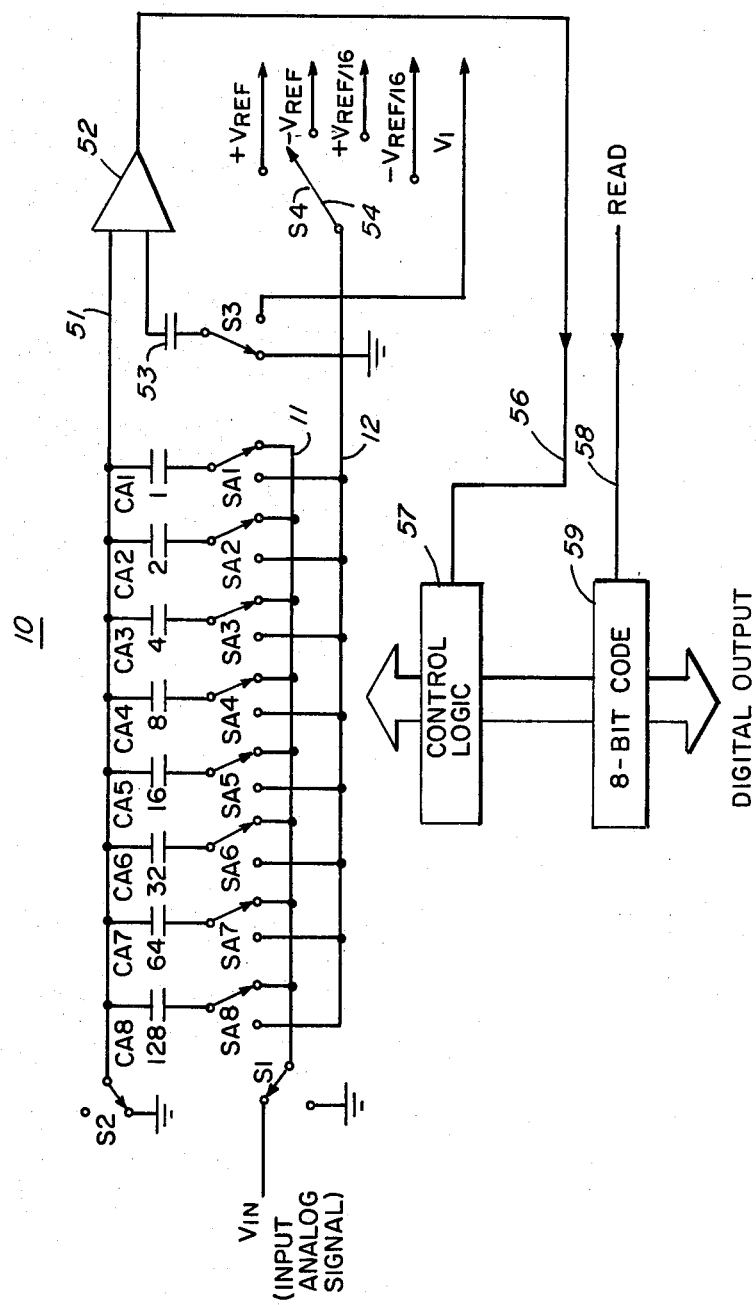
FIG. 1 is a block diagram of a charge redistribution circuit of the prior art which utilizes a reference voltage, fractions of the reference voltage, and opposite polarities of same.

Referring to FIG. 1, there is shown a charge redistribution circuit 10 for pulse code modulation encoding suitable for use in apparatus for encoding voice in a companded code to maximize signal-to-noise performance. The companded code is the fifteen segment approximation of the $\mu 255$ compression law, wherein each segment contains 16 equal size steps. The circuit 10 includes a single binary weighted capacitor array CA1, CA2, CA3 . . . CA8 for the generation of both segment and step boundaries of voice being encoded. Each capacitor CA1, CA2, CA3 . . . CA8 in the array has a pair of opposed plates, one plate of each capacitor being commonly coupled together. The circuit 10 further includes a binary comparator 52 having a first input adapted to be coupled to a reference bias potential and a second input coupled, via a line 51, to the commonly coupled plates. First switching means S5 connect and disconnect the commonly coupled plates to and from ground potential. Second switching means S1 selectively connect a first common line 11 to an input analog voice signal $V_{IN}$ or to ground potential. Third switching means S4 selectively connect a second common line 12 to a predetermined reference voltage $V_{REF}$, $-V_{REF}$, $+V_{REF}/16$ (which is one-sixteenth the predetermined voltage), or to a reference voltage $-V_{REF}/16$. Fourth switching means SA1, SA2, . . . SA8, including a switch for each capacitor, selectively couple the other plates of the capacitors to the first common line 11 or to the second common line 12. An eight-bit code generator 59 provides a digital eight-bit output upon receipt of a read instruction and control logic for controlling the four switching means, such logic being responsive to the output of the comparator 52 and providing control signals to the generator 59. Simultaneously, it causes a third switching means to connect the first comparator input to ground via the switch S3 when the sampled input signal lies in the upper four segments, and it causes the third switching means to connect the first comparator input to a reference bias potential when the sampled input signal lies in the lower four segments.

For a better understanding of the operation of the circuit as shown in FIG. 1, reference is made to U.S. Pat. No. 4,195,282 to Frank L. Cameron, issued Mar. 25, 1980, for "Charge Redistribution Circuits".

It is, of course, highly desirable that the reference voltages be precise and that the reference voltage $+V_{REF}$ and $-V_{REF}$ differ almost exactly by polarity and not by magnitude, that the voltages $+V_{REF}/16$ and $-V_{REF}/16$ differ from each other solely by polarity, and further that the reference voltages $V_{REF}/16$ be precisely one-sixteenth the magnitude of the reference voltage $V_{REF}$.

OFFSET CORRECTION CIRCUIT FOR A DIFFERENTIAL AMPLIFIER

Figure 2A:
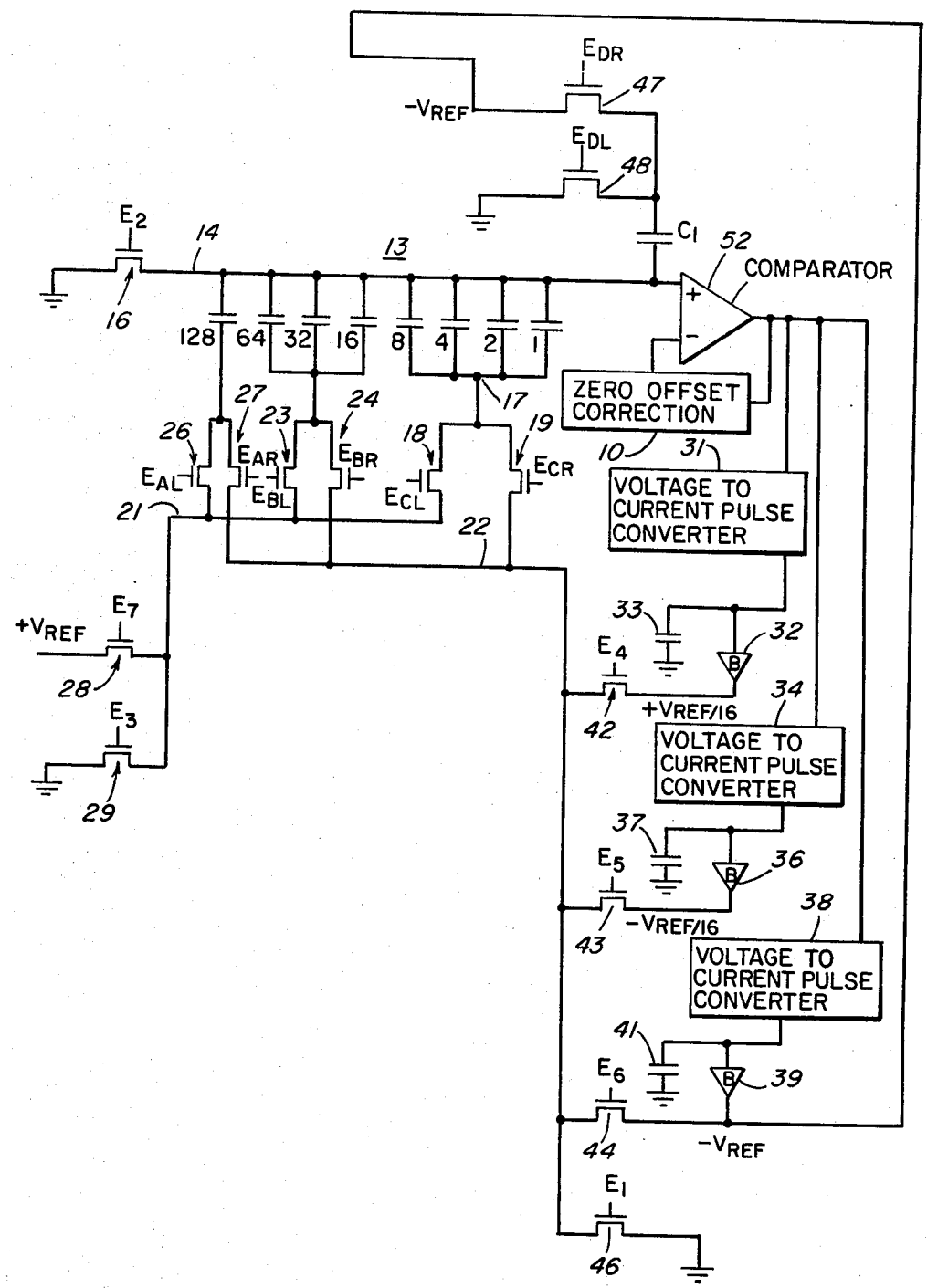
FIG. 2A is a circuit diagram of one embodiment of this invention.
Figure 2B:
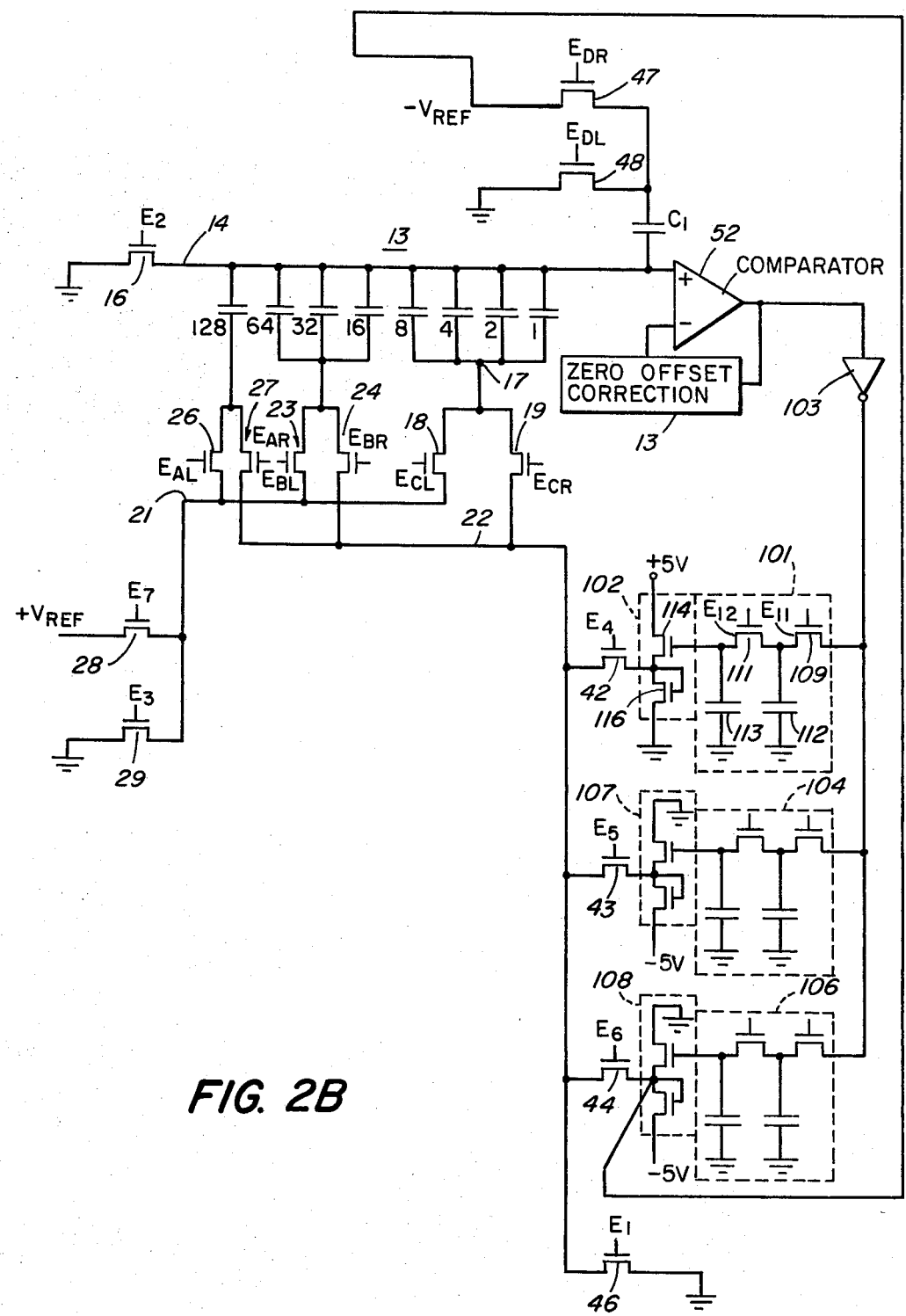
FIG. 2B is a circuit diagram of another embodiment of this invention.

Referring to FIGS. 2A and 2B, there are shown circuits in accordance with various embodiments of the invention, including a comparator 52. The output of the comparator 52 is returned to an input via a zero offset correction circuit 10. The operation of a zero offset correction circuit 10 is set forth with a great degree of particularity in a co-pending United States patent application Ser. No. 070,192, by Michael Cooperman, the applicant of this invention, filed Aug. 27, 1979, for "Offset Correction Circuit for Differential Amplifiers". As set forth therein, the output of a differential amplifier, operating as a comparator, is coupled through a first switch to charge a small valued capacitor $C_1$ (not to be confused with $C_1$ in the attached drawing). The charge in the small capacitor can be coupled through a second switch to charge a larger value capacitor $C_2$. The charge in the larger capacitor creates a voltage thereacross which is $C_1/(C_1+C_2)$ that which was initially across capacitor $C_1$.

The voltage across the capacitor $C_2$ is coupled to the negative terminal of the differential amplifier and is lessened in value via a buffer and attenuator circuit. The positive terminal is coupled to ground. The output of the comparator would normally have a polarity based upon the sign of the "offset error" of the comparator less the voltage at the negative terminal.

DESCRIPTION OF PREFERRED EMBODIMENTS

Referring to FIGS. 2A and 2B, there are shown circuit diagrams helpful for explaining the invention.

FIGS. 2A and 2B each show a capacitor array 13 including capacitors 1, 2, 4, 8, 16, 32, 64, and 128. The values of the capacitors 1, 2, 4, 8, 16, 32, 64, and 128 are weighted in binary fashion so that the actual capacitance of the various capacitors are 1 m farads, 2 m farads, 4 m farads, 8 m farads, 16 m farads, 32 m farads, 64 m farads, and 128 m farads, respectively, wherein "m" is a positive constant. All the capacitors 1, 2, 4 . . . 128 have one terminal thereof coupled together along a common line 14 to the positive input terminal of a comparator 52. The line 14 is also coupled to a source electrode of a MOSFET transistor 16 whose drain electrode is coupled to a point of reference potential, such as ground. The gate electrode of the MOSFET transistor 16 is coupled to a signal source which provides a waveform $E_2$ thereto. The capacitors 1, 2, 4, and 8 are coupled together at one terminal thereof, as at 17, to source electrodes of MOSFET transistors 18 and 19, respectively. The drain electrode of the transistor 18 is coupled to a line 21. The drain electrode of the transistor 19 is coupled to a line 22.

The capacitors 16, 32, and 64 are coupled to source electrodes of MOSFET transistors 23 and 24. The MOSFET transistor 23 has its drain electrode coupled to the line 21; the MOSFET transistor 24 has its drain electrode coupled to the line 22.

The capacitor 128 is coupled to source electrodes of a pair of MOSFET transistors 26, 27. The MOSFET transistors 26, 27 have their drain electrodes coupled to the lines 21, 22, respectively.

The MOSFET transistors 18, 19, 23, 24, 26, and 27 have their respective gate electrodes coupled to receive signals having waveforms $E_{CL}$, $E_{CR}$, $E_{BL}$, $E_{BR}$, and $E_{AL}$, $E_{AR}$, respectively.

A reference voltage $+V_{REF}$ is coupled to the source electrode of a MOSFET transistor 28 which has its drain electrode coupled to the line 21. A MOSFET transistor 29 has its source electrode coupled to a point of reference potential, such as ground, its drain electrode being coupled to the line 21. The MOSFET transistors 28 and 29 have their gate electrodes coupled to receive voltage signals $E_7$ and $E_3$, respectively.

The line 14 is coupled to the plus terminal of the comparator 52. The output of the comparator 52 is coupled, via a zero offset correction circuit 10, to the negative terminal thereof.

Referring to FIG. 2A, for one embodiment of the invention, the output of the comparator 52 is coupled via a voltage-to-current pulse converter 31 to the input of a buffer 32. The output of the converter 31 is coupled via a capacitor 33 to a point of reference potential, such as ground. The output of the comparator 52 is coupled to a second voltage-to-current pulse converter 34, the output of which is coupled to the input of a buffer 36 and also, via a capacitor 37, to a point of reference potential, such as ground. In similar fashion, the output of the comparator 52 is coupled via a third voltage-to-current pulse converter 38 to the input of a buffer 39 and also to a point of reference potential via a capacitor 41.

The output of the buffer 32, which normally provides a reference signal $+V_{REF}/16$ (which is nominally one-sixteenth that of the reference voltage $+V_{REF}$), is coupled to the source electrode of a MOSFET transistor 42 having its drain electrode coupled to the common line 22.

The output of the buffer 36 (which nominally provides a reference signal $-V_{REF}/16$) is coupled to the source electrode of a MOSFET transistor 43 having its drain electrode coupled to the common line 22. The output of the buffer 39, which provides a nominal signal $-V_{REF}$, is coupled to the source electrode of a MOSFET transistor 44 which has its drain electrode coupled to the common line 22.

The common line 22 is coupled to the source electrode of a MOSFET transistor 46 having its drain electrode coupled to a point of reference potential. The nominal voltage $-V_{REF}$, at the output of the buffer 39, is applied to the source electrode of a MOSFET transistor 47 having its drain electrode coupled (via a capacitor $C_1$) to the input line 14. Similarly, a MOSFET transistor 48 has its source electrode coupled to a point of reference potential, such as ground, its drain electrode being coupled (via the capacitor $C_1$) to the input line 14.

Referring to FIG. 2B, for a second embodiment of the invention (and a preferred mode), the output of the comparator 52 is coupled to the input of a capacitive attenuator/memory 101 which controls a voltage divider 102. An output of the voltage divider 102, which normally provides a reference signal $+V_{REF}/16$ (which is nominally one-sixteenth that of the reference voltage $+V_{REF}$), is coupled to the source electrode of the MOSFET transistor 42 having its drain electrode coupled to the common line 22.

The output of the comparator 52, inverted by an inverter 103, is applied to the inputs of second and third capacitive attenuator/memories 104, 106 which control voltage dividers 107, 108, respectively. The output of the voltage divider 107, which nominally provides a reference signal $-V_{REF}/16$, is coupled to the source electrode of the MOSFET transistor 43 having its drain electrode coupled to the common line 22. The output of the voltage divider 108, which provides a nominal signal $-V_{REF}$, is coupled to the source electrode of a MOSFET transistor 44 which has its drain electrode coupled to the common line 22.

The common line 22 is coupled to the source electrode of a MOSFET transistor 46 having its drain electrode coupled to a point of reference potential. The nominal voltage $-V_{REF}$, at the output of the voltage divider 108, is applied to the source electrode of a MOSFET transistor 47 having its drain electrode coupled (via a capacitor $C_1$) to the input line 14. Similarly, a MOSFET transistor 48 has its source electrode coupled to a point of reference potential, such as ground, its drain electrode being coupled (via a capacitor $C_1$) to the input line 14.

A capacitive attenuator/memory and associated voltage divider include various components as indicated in the boxes 101, 102 in FIG. 2B. The input of the capacitive attenuator/memory is applied to a source electrode of a MOSFET transistor 109 having its drain electrode coupled to the source electrode of a MOSFET transistor 111. The drain electrode of the MOSFET transistor 109 is coupled to one terminal of a small-valued capacitor 112 (such as 0.04 pf) having a second terminal coupled to a point of reference potential. The drain electrode of the MOSFET transistor 111 is coupled to one terminal of a larger-valued capacitor 113 (such as 20 pf) having a second terminal coupled to a point of reference potential.

The drain electrode of the MOSFET transistor 111 (the "output" of the capacitive attenuator/memory 101) controls the voltage divider 102 by being applied to a gate electrode of a MOSFET transistor 114. The source electrode of the MOSFET transistor 114 receives a $+5$ V power source. The drain electrode of the MOSFET transistor 114 is coupled to the source electrode of a MOSFET transistor 116 having its drain electrode coupled to a source of reference potential, such as ground.

The gate and source electrodes of the MOSFET transistor 116 are coupled together and applied, as an output of the voltage divider 102, to the source electrode of the MOSFET transistor 42.

The operation of the capacitive attenuator/memory is similar in most respects to similar circuitry described in the co-pending U.S. patent application Ser. No. 070,192, the description and operation of which is incorporated herein by reference.

A timing pulse $E_{11}$ is applied at a periodic rate to the gate electrode of the MOSFET transistor 109, turning on the transistor 109, and tending to charge the capacitor 112. Periodically, a timing pulse $E_{12}$ is applied to the gate electrode of the MOSFET transistor 111 (but out of phase with regard to the pulses $E_{11}$). The two transistors 109, 111 do not conduct simultaneously. When the transistor 111 conducts, a portion of the charge on the capacitor 112 is transferred to the capacitor 113. In time, the charge stored on the capacitor 113 controls the voltage divider 102 so that its output yields the desired $+V_{REF}/16$ reference signal.

The MOSFET transistors 42, 43, 44, 46, 47, and 48 have their gate electrodes coupled to receive voltage signals $E_4$, $E_5$, $E_6$, $E_1$, $E_{DR}$, and $E_{DL}$, respectively.

Figure 3:
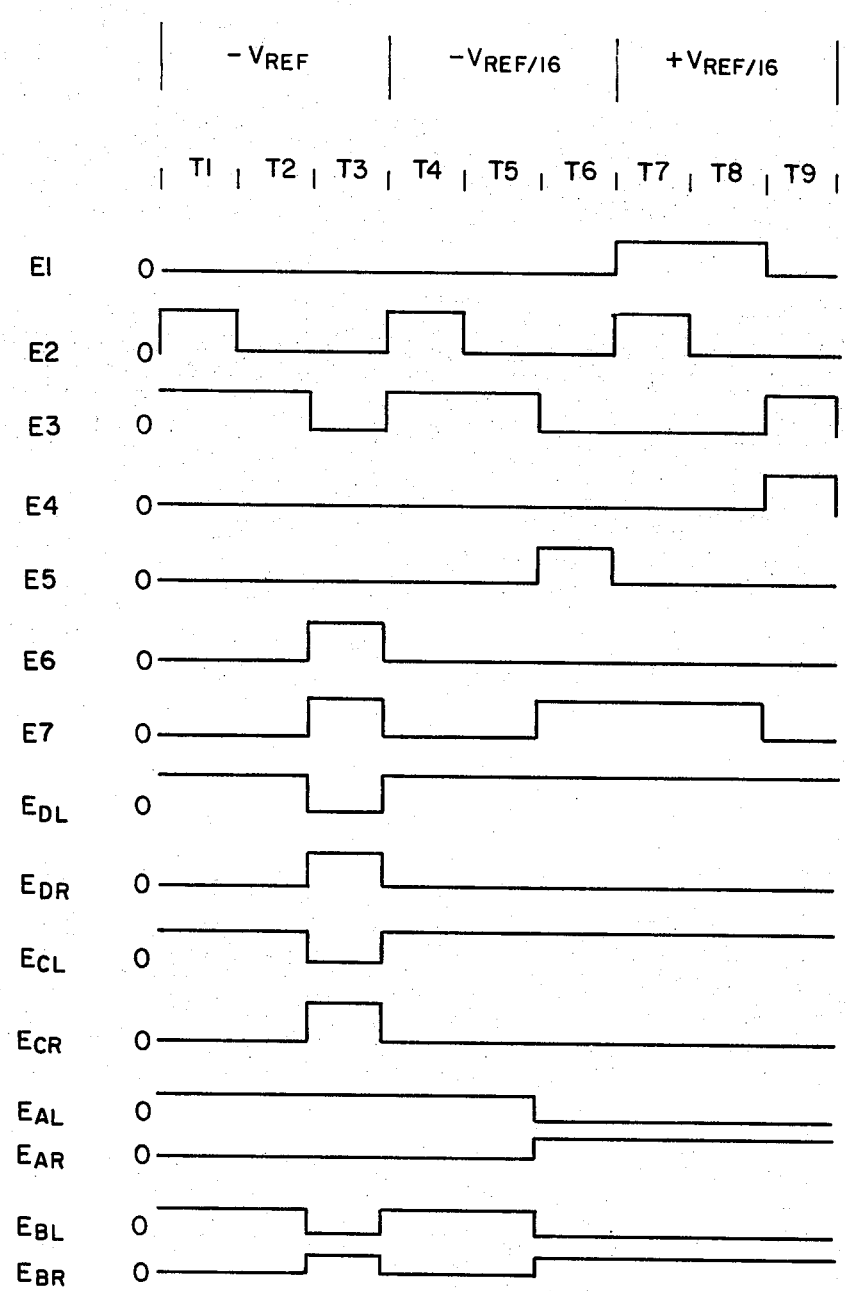
FIG. 3 is a set of waveforms helpful for an understanding of this invention.

Referring to FIG. 3, there is shown a chart which illustrates the voltage waveforms for the various waveforms $E_1$, $E_2$, $E_3$, $E_4$, $E_5$, $E_6$, $E_7$, $E_{DL}$, $E_{DR}$, $E_{CL}$, $E_{CR}$, $E_{AL}$, $E_{AR}$, $E_{BL}$, and $E_{BR}$, respectively. At various time intervals, $T_1$ through $T_9$, the time intervals repeat cyclically. During the time intervals $T_1$, $T_2$, $T_3$, the voltage reference signal $-V_{REF}$ is generated. During the time intervals $T_4$, $T_5$, $T_6$, the reference signal $-V_{REF}/16$ is generated, and during the time intervals $T_7$, $T_8$, $T_9$, the reference signal $+V_{REF}/16$ is generated.

The time intervals $T_1$, $T_2$, $T_3$, $T_4$, $T_5$, $T_6$, $T_7$, $T_8$, $T_9$ are sequentially repeated. Operation of the circuit can be initiated at either time intervals $T_1$, $T_4$, or $T_7$.

At time $T_7$, as shown in FIGS. 2A, 2B, and 3, the MOSFET transistor 28 is activated because of the enabling signal on the gate electrode provided by the voltage level $E_7$ thereon. Hence, the voltage reference signal $+V_{REF}$ is applied along the line 21. At time $T_7$, $E_{AL}$ is low, and $E_{BL}$ is low, whereby the MOSFET transistors 26 and 23 are non-activated. However, since the voltage level $E_{CL}$ is high, the MOSFET transistor 18 is activated, whereby the voltage reference signal $+V_{REF}$ is applied through both MOSFET transistors 28, 18 to the common line 17. Hence, the voltage reference signal $+V_{REF}$ is applied to one side of the parallel capacitors 1, 2, 4, 8, the opposite side being coupled to the common line 14.

With the high voltage level $E_2$ being applied to the gate electrode of the MOSFET transistor 16, the line 14 becomes coupled to a point of reference potential, such as ground. The transistors 24 and 27 are coupled along the line 22, via the MOSFET transistor 46, to a point of reference potential, such as ground (due to the enabling voltage level $E_1$ which is applied to the gate electrode of the MOSFET transistor 46). Thus, the potential at the line 22 is at ground potential. The transistors 27 and 24 are activated due to the positive levels of $E_{AR}$ and $E_{BR}$ at their gate electrodes. Hence, both sides of the capacitors 16, 32, 64, and 128 are at ground potential. The MOSFET transistor 48, having its gate electrode activated by a positive level $E_{DL}$, couples the capacitor $C_1$ to ground. Hence, in summary, at time $T_7$, the capacitors 16, 32, 64, 128, and $C_1$ are grounded at both terminals, whereas the capacitors 1, 2, 4, and 8 have the voltage signal $V_{REF}$ applied thereto at the line 17, the opposite side (at line 14) being coupled to a point of reference potential, such as ground.

At $T_8$, the only change in the applied levels occurs with the signal $E_2$ which drops to zero. Hence, the MOSFET transistor 16 open circuits, permitting the line 14 to float.

At time $T_9$, the voltage level $E_7$ drops to zero, whereby the MOSFET transistor 28 open circuits; the voltage level $E_3$ becomes positive, whereby the MOSFET transistor 29 is activated, bringing the line 21 to ground potential. The voltage level $E_1$ drops to zero, open circuiting the MOSFET transistor 46; the voltage level $E_4$ becomes enabling, activating the MOSFET transistor 42, applying the signal $+V_{REF}/16$ to the common line 22. Since the capacitors 1, 2, 4, 8 have been previously charged due to the voltage level $+V_{REF}$ applied thereto, the voltage on the capacitors 8, 4, 2, 1 (at line 14) tends to drop towards $-V_{REF}$ due to the switching of the line 21 from the voltage source $+V_{REF}$ to ground. That is, it would tend to drop toward $$-V_{REF}\left(\frac{C_{8+4+2+1}}{C_{128+64+32+16+8+4+2+1}}\right).$$

However, since the nominal signal $+V_{REF}/16$ applied from the buffer 32 via the MOSFET transistor 42 is applied to the capacitors 16, 32, 64, 128, the voltage due to the $+V_{REF}/16$ signal tends to become $$+\frac{V_{REF}}{16}\left(\frac{C_{128+64+32+16}}{C_{128+64+32+16+8+4+2+1}}\right).$$

The two voltages, thus, tend to balance.

In repetitive fashion, the output of the buffer 32 tends to generate signals which are precisely one-sixteenth that of the reference voltage $V_{REF}$.

For the generation of the reference voltage $-V_{REF}$, attention is directed to time intervals $T_1$, $T_2$, and $T_3$ (see FIG. 3).

At time $T_1$, voltage level $E_{DL}$ is positive, whereby the MOSFET transistor 48 is conductive. Hence, the capacitor $C_1$ has one terminal coupled to a point of reference potential, such as ground, through the MOSFET transistor 48, the other terminal being coupled to ground through MOSFET transistor 16 (since, at that time, voltage level $E_2$ is positive, enabling MOSFET transistor 16). Coincidentally, voltage level $E_3$ is positive so that the MOSFET transistor 29 is conductive, whereby a point of reference potential, such as ground, is applied to the common line 21. The line 21 applies a ground potential through the MOSFET transistor 26 (because the enabling voltage level $E_{AL}$ is positive), through the MOSFET transistor 23 (because the enabling voltage level $E_{BL}$ is positive), and through the MOSFET transistor 18 (because the enabling voltage level $E_{CL}$ is positive). Thus, the capacitors 1, 2, 4, 8, 16, 32, 64, 128, and $C_1$ are effectively grounded at all terminals thereof.

At time period $T_2$, the voltage level $E_2$ drops, the remaining voltage levels remain unchanged. Hence, at the time $T_2$, the line 14 is permitted to float.

At time $T_3$, the voltage level $E_7$ becomes positive and the voltage level $E_3$ drops, whereby the MOSFET transistor 28 becomes conductive and the MOSFET transistor 29 becomes nonconductive, thereby applying the reference voltage $+V_{REF}$ to the line 21. The voltage level $E_{AL}$ remains unchanged, whereby the MOSFET transistor 26 remains conductive. However, the voltage levels $E_{BL}$, $E_{CL}$ drop, whereby the MOSFET transistors 23, 18 are de-activated.

The voltage level $E_{DL}$ drops and the voltage level $E_{DR}$ becomes positive, whereby the MOSFET transistor 48 is deactivated and the MOSFET transistor 47 is activated.

When the voltage level $E_6$ becomes positive, the MOSFET transistor 44 is activated, applying the nominal voltage level $-V_{REF}$ from the buffer 39 through the line 22 to the transistors 19 and 24. Since the voltage levels $E_{BR}$ and $E_{CR}$ are positive, the voltage level $-V_{REF}$ is applied through the activated transistors 24 and 19 to the capacitors 64, 32, 16 and 8, 4, 2, 1, respectively.

Thus, at the time interval $T_3$, it is noted that, due to the voltage reference signal $+V_{REF}$, the capacitor 128 applies its charge to the comparator 52. At the same time, the capacitors 64, 32, 16, 8, 4, 2, 1, and $C_1$ (which has a capacitance of 1 m farads) apply charges to the comparator 52 due to the voltage level $-V_{REF}$. Hence, the two tend to cancel each other.

With regard to the generation of the voltage level $-V_{REF}/16$, reference is made to the time intervals $T_4$, $T_5$, $T_6$.

At time $T_4$, voltage levels $E_2$, $E_3$, $E_{AL}$, $E_{BL}$, $E_{CL}$, and $E_{DL}$ are positive. Thus, the transistors 16, 29, 26, 23, 18, and 48 are all activated to permit conduction therethrough. Thus, with such foregoing voltage levels at positive potential, the capacitors 1, 2, 4, 8, 16, 32, 64, 128, and $C_1$ have all their terminals coupled to a point of reference potential, such as ground.

At time period $T_5$, the only change is that the voltage level $E_2$ drops to zero, open-circuiting the transistor 16, permitting the line 14 to float.

At time $T_6$, voltage levels $E_1$, $E_2$, $E_4$, and $E_6$ remain low (MOS transistors 46, 16, 42, and 44 remain non-conducting); voltage level $E_{DL}$ remains positive (MOS transistor 48 remains activated); voltage level $E_{DR}$ remains low (MOS transistor 47 remains non-conductive); voltage level $E_{CL}$ remains positive (MOS transistor 18 remaining activated); voltage level $E_{CR}$ remains low (MOS transistor 19 remaining non-conductive). However, at time interval $T_6$, various changes do occur. Voltage level $E_3$ drops, whereby MOS transistor 29 ceases to conduct; voltage level $E_5$ increases, turning on the MOS transistor 43 so as to couple the output of the buffer 36 to the line 22, the buffer 36 output being indicative of the $-V_{REF}/16$ voltage level. Voltage level $E_7$ increases, whereby the MOS transistor 28 conducts, applying the $+V_{REF}$ signal onto the line 21. The voltage level $E_{AL}$ drops and the voltage level $E_{AR}$ increases, whereby the MOS transistor 26 ceases conduction, and the MOS transistor 27 is activated. In like fashion, the voltage levels $E_{BL}$ and $E_{BR}$ drop and increase, respectively, whereby the MOS transistors 23 and 24 cease conduction and initiate conduction, respectively. Thus, at time $T_6$, the signal $+V_{REF}$ is applied through the MOS transistor 28, onto the line 21, through the MOS transistor 18, to the line 17 which is coupled to one side of the capacitors 1, 2, 4, and 8. The output from the buffer 36, which applies a $-V_{REF}/16$ signal through the MOS transistor 43 to the line 22, is coupled via the transistors 24, 27 to one side of the capacitors 16, 32, 64, and 128. The other sides of the capacitors 1, 2, 4, 8, 16, 32, 64, 128 are coupled via the line 14 to the plus terminal of the comparator 52. The capacitor $C_1$ has one terminal coupled to the comparator 52, and has a second terminal coupled via the now-activated transistor 48 to a point of reference potential, such as ground.

There has been described new and improved methods of and apparatus for generating precise reference voltages, especially useful for the operation of coders and decoders. Through the utilization of this invention, accuracies can be obtained over that of the prior art by at least an order of magnitude. Such new systems require less power and less integrated chip area than similar devices of prior art.

To summarize, the generation of $+V_{REF}/16$ is set forth:

1. The transistors 46, 16, 28, 48, 18, 27, and 24 are activated during time $T_7$. This causes the capacitors 1, 2, 4, and 8 to charge with $+V_{REF}$. All other capacitors 16, 32, 64, 128, and $C_1$ are discharged.

2. During time $T_8$, the transistor 16 is non-conductive. This causes the input to the comparator 52 to float, but the voltage applied to the input thereof remains at zero potential.

3. During the time period $T_9$, the transistors 29 and 18 are closed (i.e., conductive), which tends to cause the input line 14 to the comparator 52 to become negative. However, the transistors 42, 24, and 27 are also closed (i.e., conductive), which tends to impose a positive voltage on the capacitors 128 and 16, 32, and 64 where they couple to the line 14. The voltages at the comparator 52 input due to $+V_{REF}$ and $+V_{REF}/16$ superimpose and cancel each other.

Voltage at comparator input due to $+V_{REF} =$ $$-V_{REF} \times \frac{C_{1+2+4+8}}{C_{1+2+4+8} + C_{16+32+64} + C_{128}} = -\frac{60}{255}$$

Voltage at comparator input due to $+\frac{V_{REF}}{16} =$ $$+\frac{V_{REF}}{16} \times \frac{C_{16+32+64} + C_{128}}{C_{1+2+4+8} + C_{16+32+64} + C_{128}} = +\frac{60}{255}$$

Thus, when the correct voltage is applied to the transistor 42, the input to the comparator 52 is theoretically zero.

Let it be assumed that the voltage at the transistor 42 is lower than $+V_{REF}/16$ (i.e., 200 mv). The mechanism for correcting this voltage to bring it close to 250 millivolts will now be described.

When $V_{REF}/16$ is 200 millivolts, then the voltage at the comparator 52 input becomes:

$$(0.200 \times 240/255) - 60/255 = -12/255 \text{ volt}.$$

The foregoing causes the inverted output of the comparator 52 to become positive. Such positive voltage is converted to a positive current pulse by the converter 31 which causes a slight increase of charge at the input of the buffer 32. This makes the buffer output higher than 200 millivolts. This process continues at a predetermined clock rate and $+V_{REF}/16$ keeps increasing. Eventually, $V_{REF}/16$ overshoots the desired value of 250 millivolts. This makes the inverted comparator 52 output negative, and the capacitor charge at the buffer 32 input is decreased. The correction steps can be made a fraction of a millivolt, thereby causing $+V_{REF}/16$ to be within a fraction of a millivolt of the desired value.

The other voltages (i.e., $-V_{REF}$ and $-V_{REF}/16$) are generated in a similar manner during different time intervals, as described hereinabove. $-V_{REF}$ and $-V_{REF}/16$ have their own voltage-to-current pulse converters 38, 34 and buffers 39, 36, respectively. The sequence of events is summarized with the flow chart as set forth below and the timing waveforms in FIG. 3.

The foregoing scheme can be implemented by time sharing the capacitor array 13, between its encoding function and reference voltage generation, which can be performed by increasing the number of time slots. An alternate implementation, where speed is emphasized, is to use a dedicated capacitor and comparator for reference voltage generation. In such latter case, the capacitor array need not be as elaborate as a codec (coder/decoder) array. The choice of implementation depends on what is most desirable: speed, power, or space.

| Step | Voltage |
|---|---|
| 1. Discharge all capacitors via transistor 29<br>2. Float the line 14 (E$_2$ low)<br>3. Apply V$_{REF}$ to capacitor 128 and apply $-$V$_{REF}$ to the capacitors C$_1$ and capacitors 1, 2, 4, 8, 16, 32, and 64 | $-$V$_{REF}$ |
| 4. Discharge all capacitors via the transistor 29<br>5. Float the line 14 (E$_2$ low)<br>6. Apply V$_{REF}$ to capacitors 1, 2, 4, and 8 and apply $-\dfrac{V_{REF}}{16}$ to capacitors 128 and 16, 32, and 64 | $-\dfrac{V_{REF}}{16}$ |
| 7. Charge capacitors 1, 2, 4, and 8 with V$_{REF}$ and discharge all other capacitors 16, 32, 64, and 128 via the transistor 46<br>8. Float the line 14 (E$_2$ low)<br>9. Ground the lower terminal 17 of the capacitors 1, 2, 4, and 8 and apply $+\dfrac{V_{REF}}{16}$ to the capacitors 16, 32, 64, and 128 | $+\dfrac{V_{REF}}{16}$ |

To provide for precision voltage references $+$V$_{REF}$, $-$V$_{REF}$, and $+$V$_{REF}/16$, $-$V$_{REF}/16$, the desired $+$V$_{REF}$ is generated with a temperature stable circuit (which circuit is not material to an understanding of this invention). The remaining three voltage references are derived from $+$V$_{REF}$.

The basic operation includes the generation of an approximate $+$V$_{REF}/16$ voltage which is compared with $+$V$_{REF}$ in the capacitor array and in the comparator. The comparator 52 output, then, is used to control the transistors until a precise V$_{REF}/16$ is obtained. It is noted that offset correction occurs in parallel by the circuit 13 and is independent of the reference voltage generation.

The sequence of the generation of each reference voltage is provided by three times slots as described hereinabove. The reference voltage $+$V$_{REF}/16$ is generated during the time slots 7, 8, and 9.

During the time slot T$_7$, the capacitors 1, 2, 4, 8 are charged to $+$V$_{REF}$ while the capacitors 16, 32, 64, 128 are discharged. The plus terminal of the comparator 52 is coupled to a point of reference potential, such as ground.

During the time slot T$_8$, the transistor 16 is rendered non-conductive, which causes the input line 14 to the comparator 52 to float.

During the time interval T$_9$, the lower terminal 17 of the capacitors 1, 2, 4, 8 is grounded via the activated transistor 29 (transistor 28 being rendered non-conductive). However, the capacitors 1, 2, 4, 8 remain charged; hence, the voltage on the line 14 becomes negative. At the same time, the transistor 46 is de-activated, and the transistor 42 is activated which applies $+$V$_{REF}/16$ along the line 22 to the capacitors 16, 32, 64, and 128. The voltages due to $+$V$_{REF}$ and $+$V$_{REF}/16$ subtract at the positive comparator 52 input terminal. Thus, the voltage at the positive input terminal 52 is equal to the sum of the voltage at the comparator input due to $+$V$_{REF}$ and the voltage at the comparator input due to $+$V$_{REF}/16$ which is equal to $$\left(-V_{REF} \times \frac{C_{1+2+4+8}}{C_{1+2+4+8} + C_{16+32+64} + C_{128}}\right) +$$

-continued $$\left(\frac{V_{REF}}{16} \times \frac{C_{16+32+64} + C_{128}}{C_{1+2+4+8} + C_{16+32+64} + C_{128}}\right)$$

Hence, the voltage at the positive input terminal 52 becomes zero when $$\left(-V_{REF} \times \frac{C_{1+2+4+8}}{C_{1+2+4+8} + C_{16+32+64} + C_{128}}\right) +$$
$$\left(\frac{V_{REF}}{16} \times \frac{C_{16+32+64} + C_{128}}{C_{1+2+4+8} + C_{16+32+64} + C_{128}}\right) = 0$$

The above equation results in $$\frac{V_{REF}}{16} = V_{REF} \times \frac{C_{1+2+4+8}}{C_{16+32+64} + C_{128}} =$$
$$V_{REF} \times \frac{15}{112 + 128} = V_{REF} \times \frac{1}{16}$$

It is noted that, at time T$_9$, a voltage is applied via the transistors 42, 24, and 27 to the capacitors 16, 32, 64, and 128 for providing the precise reference voltage $+$V$_{REF}/16$. Likewise, at time T$_6$, the output of the buffer 36 is applied through the transistor 43 to the line 22, through the transistors 24, 27, to the capacitors 16, 32, 64, and 128 to provide the reference voltage $-$V$_{REF}/16$. However, at time T$_3$, the buffer 39 applies the $-$V$_{REF}$ signal via the transistor 44, and the line 22, to the capacitors 1, 2, 4, 8 and 16, 32, 64 (and to the capacitor C$_1$ via the transistor 47).

It is convenient and desirable, in practicing this invention, to have separate sets of capacitors: one having a capacitance of 128 m farads; one having a value of 112 m farads (i.e., 16+32+64); and one having a capacitance of 15 m farads (i.e., 1+2+4+8), wherein "m" is a positive constant. The various amounts of capacitances for the foregoing capacitors can be integrally equal to picofarads, respectively. That is, the capacitor 128 can have a capacitance of 128 pf, the capacitor 8 can have a capacitance of 8 pf, and the like. However, other values can be used as long as the capacitances of all of the foregoing capacitors 1, 2, 4, 8, 16, 32, 64, 128 are multiplied by the same constant.

The voltage-to-current pulse converters 31, 34, 38 assist in the storage of errors existing at the output terminal of the comparator 52. The output of the converters 31, 34, 38 both is coupled to a capacitor 33, 37, 41, respectively, and is coupled to respective buffers 32, 36, and 39. The capacitor 33, for example, provides the buffer 32 with a low impedance voltage source. A voltage stored on the capacitor 33 is held by the buffer 32. The output of the buffer is related in a very precise fashion to its input so that, in order to change the output voltage by a certain amount, a current pulse of a fixed duration is applied to the input thereto. At the next cycle, a redetermination is performed as to whether the voltage is too high or too low, and again, the procedure is repeated.

Other modifications of this invention can be performed without departing from the spirit and scope of this invention. In lieu of MOSFET transistors, other transistors and other gating circuits can be used.

What is claimed is:

1. In a system utilizing a reference voltage V, a method for providing a precise reference voltage xV comprising the steps of
   (a) applying said reference voltage V to one side of a first capacitor while the opposite side of said first capacitor is coupled to a point of reference potential;
   (b) with said opposite side of said first capacitor coupled to an input terminal of a comparator, decoupling said opposite side of said first capacitor from said point of reference potential, permitting said opposite side to "float";
   (c) applying said point of reference potential to said one side of said first capacitor while said opposite side of said first capacitor remains coupled to said input terminal of said comparator; converting an output of said comparator to a nominal reference voltage xV; applying said nominal reference voltage xV to one side of a second capacitor while the opposite side of said second capacitor is coupled to said input terminal of said comparator; and
   (d) coupling all sides of said capacitors to said point of reference potential; and cyclically repeating the foregoing steps, wherein the ratio of the value of said first capacitor to the value of said second capacitor is x.

2. In a system utilizing a reference voltage V, a method for providing a precise reference voltage xV comprising the steps of
   (a) applying said reference voltage V to one side of a first capacitor while the opposite side of said first capacitor is coupled to a point of reference potential;
   (b) with said opposite side of said first capacitor coupled to an input terminal of a comparator, decoupling said opposite side of said first capacitor from said point of reference potential, permitting said opposite side to "float";
   (c) applying said point of reference potential to said one side of said first capacitor while said opposite side of said first capacitor remains coupled to said input terminal of said comparator; converting a voltage output of said comparator to a current pulse and storing said current pulse; applying said stored pulse through a buffer to provide a nominal reference voltage xV; applying said nominal reference voltage xV to one side of a second capacitor while the opposite side of said second capacitor is coupled to said input terminal of said comparator; and
   (d) coupling all sides of said capacitors to said point of reference potential; and cyclically repeating the foregoing steps, wherein the ratio of the value of said first capacitor to the value of said second capacitor is x.

3. In a system utilizing a reference voltage V, a method for providing a precise reference voltage $V/2^n$ comprising the steps of
   (a) applying said reference voltage V to one side of a first capacitor while the opposite side of said first capacitor is coupled to a point of reference potential;
   (b) with said opposite side of said first capacitor coupled to an input terminal of a comparator, decoupling said opposite side of said first capacitor from said point of reference potential, permitting said opposite side to "float";
   (c) applying said point of reference potential to said one side of said first capacitor while said opposite side of said first capacitor remains coupled to said input terminal of said comparator; converting a voltage output of said comparator to a current pulse and storing said current pulse; applying said stored pulse through a buffer to provide a nominal reference voltage $V/2^n$; applying said nominal reference voltage $V/2^n$ to one side of a second capacitor while the opposite side of said second capacitor is coupled to said input terminal of said comparator; and
   (d) coupling all sides of said capacitors to said point of reference potential; and cyclically repeating the foregoing steps, wherein
   said first capacitor has a value of $(2^{n-1} + \ldots + 2^1 + 2^0)$ m farads,
   said second capacitor has a value of $(2^{2n-1} + \ldots + 2^n)$ m farads,
   n is a positive integer, and
   m is a positive constant.

4. The method as recited in claim 3 wherein n=4, said first capacitor and said second capacitor have values of capacitance in a ratio of 15:240.

5. The method as recited in claim 4 wherein said second capacitor includes two parallel capacitive banks having a ratio of 128:112.

6. In a system providing a reference voltage +V, a method for providing precise reference voltages $+V/2^n$, $-V/2^n$, and $-V$, comprising the steps of
   (a) applying said reference voltage +V to one side of a first capacitor while the opposite side of said first capacitor is coupled to a point of reference potential;
   (b) with said opposite side of said first capacitor coupled to an input terminal of a comparator, decoupling said opposite side of said first capacitor from said point of reference potential, permitting said opposite side to "float";
   (c) applying said point of reference potential to said one side of said first capacitor while said opposite side of said first capacitor remains coupled to said input terminal of said comparator; converting a voltage output of said comparator to a first current pulse and storing said first current pulse; applying said stored pulse through a first buffer to provide a nominal reference voltage $+V/2^n$; applying said nominal reference voltage $+V/2^n$ to one side of a second capacitor and to one side of a third capacitor while the opposite sides of said second and said third capacitors are coupled to said input terminal of said comparator;
   (d) coupling all sides of all said capacitors to said point of reference potential;
   (e) with said opposite sides of said capacitors coupled to said input terminal of said comparator, decoupling said opposite sides of said capacitors from said point of reference potential, permitting said opposite sides to "float";
   (f) applying said reference voltage +V to said one side of said third capacitor while said opposite sides of said capacitors remain coupled to said input terminal of said comparator; converting a voltage output of said comparator to a second current pulse and storing said second current pulse; applying said stored second current pulse through a second buffer to provide a nominal reference voltage $-V$; applying said nominal reference voltage $-V$ to said one side of said first capacitor, to said first side of said second capacitor and to one side of a fourth capacitor, an opposite side of said fourth capacitor being coupled to said input terminal of said comparator;

(g) coupling all sides of all said capacitors to a point of reference potential;

(h) with said opposite sides of said capacitors coupled to said input terminal of said comparator, decoupling said opposite sides of said capacitors from said point of reference potential, permitting said opposite sides to "float"; and (i) applying said reference voltage $+V$ to said one side of said first capacitor while said opposite sides of said first capacitor remain coupled to said input terminal of said comparator; converting a voltage output of said comparator to a third current pulse and storing said third current pulse; applying said stored third current pulse through a third buffer to provide a nominal reference voltage $-V/2^n$; applying said nominal reference voltage $-V/2^n$ to said one side of said second capacitor and to said one side of said third capacitor, said one side of said fourth capacitor being coupled to said point of reference potential, wherein said first capacitor has a value of $(2^{n-1}+ \ldots +2^1+2^0)$ m farads, said second capacitor has a value of $(2^{2n-2}+ \ldots +2^n)$ m farads, said third capacitor has a value of $2^{2n-1}$ m farads, said fourth capacitor has a value of 1 m farads, n is positive integer, and m is a positive constant.

7. The method as recited in claim 6 wherein n=4, said first capacitor, said second capacitor, said third capacitor, and said fourth capacitor have values of capacitance in proportion of 15, 112, 128, and 1, respectively.

8. The method as recited in claim 6 wherein said steps are cyclically repeated.

9. The method as recited in claim 6 wherein said steps (a), (b), (c), (d), (e), (f), (g), (h), and (i) are cyclically repeated.

10. The method as recited in claim 6 wherein said steps (a), (b), (c), (g), (h), (i), (d), (e), and (f) are performed in repeated sequential order.

11. In a system utilizing a reference voltage V, a method for providing a precise reference voltage $V/2^n$ comprising the steps of (a) applying said reference voltage V to one side of a first capacitor while the opposite side of said first capacitor is coupled to a point of reference potential;

(b) with said opposite side of said first capacitor coupled to an input terminal of a comparator, decoupling said opposite side of said first capacitor from said point of reference potential, permitting said opposite side to "float";

(c) applying said point of reference potential to said one side of said first capacitor while said opposite side of said first capacitor remains coupled to said input terminal of said comparator; storing an output of said comparator; applying said stored output through a voltage divider to provide a nominal reference voltage $V/2^n$; applying said nominal reference voltage $V/2^n$ to one side of a second capacitor while the opposite side of said second capacitor is coupled to said input terminal of said comparator; and (d) coupling all sides of said capacitors to said point of reference potential; and cyclically repeating the foregoing steps, wherein said first capacitor has a value of $(2^{n-1}+ \ldots +2^1+2^0)$ m farads, said second capacitor has a value of $(2^{2n-1}+ \ldots +2^n)$ m farads, n is a positive integer, and m is a positive constant.

12. The method as recited in claim 11 wherein n=4, said first capacitor and said second capacitor have values of capacitance in a ratio of 15:240.

13. The method as recited in claim 12 wherein said second capacitor includes two parallel capacitive banks having a ratio of 128:112.

14. In a system utilizing a reference voltage $+V$, a method for providing precise reference voltages $+V/2^n$, $-V/2^n$, and $-V$, comprising the steps of (a) applying said reference voltage $+V$ to one side of a first capacitor while the opposite side of said first capacitor is coupled to a point of reference potential;

(b) with said opposite side of said first capacitor coupled to an input terminal of a comparator, decoupling said opposite side of said first capacitor from said point of reference potential, permitting said opposite side to "float";

(c) applying said point of reference potential to said one side of said first capacitor while said opposite side of said first capacitor remains coupled to said input terminal of said comparator; storing a first output of said comparator; applying said first stored output through a first voltage divider to provide a nominal reference voltage $+V/2^n$; applying said nominal reference voltage $+V/2^n$ to one side of a second capacitor and to one side of a third capacitor while the opposite sides of said second and said third capacitors are coupled to said input terminal of said comparator;

(d) coupling all sides of all said capacitors to said point of reference potential;

(e) with said opposite sides of said capacitors coupled to said input terminal of said comparator, decoupling said opposite sides of said capacitors from said point of reference potential, permitting said opposite sides to "float";

(f) applying said reference voltage $+V$ to said one side of said third capacitor while said opposite sides of said capacitors remain coupled to said input terminal of said comparator; storing a second output of said comparator; applying said stored second output through a second voltage divider to provide a nominal reference voltage $-V$; applying said nominal reference voltage $-V$ to said one side of said first capacitor, to said first side of said second capacitor and to one side of a fourth capacitor, an opposite side of said fourth capacitor being coupled to said input terminal of said comparator;

(g) coupling all sides of all said capacitors to a point of reference potential;

(h) with said opposite sides of said capacitors coupled to said input terminal of said comparator, decoupling said opposite sides of said capacitors from said point of reference potential, permitting said opposite sides to "float"; and (i) applying said reference voltage +V to said one side of said first capacitor while said opposite sides of said first capacitor remain coupled to said input terminal of said comparator; storing a third output of said comparator; applying said stored third output through a third voltage divider to provide a nominal reference voltage $-V/2^n$; applying said nominal reference voltage $-V/2^n$ to said one side of said second capacitor and to said one side of said third capacitor, said one side of said fourth capacitor being coupled to said point of reference potential, wherein said first capacitor has a value of $(2^{n-1}+ \ldots +2^1+2^0)$ m farads, said second capacitor has a value of $(2^{2n-2}+ \ldots +2^n)$ m farads, said third capacitor has a value of $2^{2n-1}$ m farads, said fourth capacitor has a value of 1 m farads, n is a positive integer, and m is a positive constant.

15. The method as recited in claim 14 wherein n=4, said first capacitor, said second capacitor, said third capacitor, and said fourth capacitor have values of capacitance in proportion of 15, 112, 128, and 1, respectively.

16. The method as recited in claim 14 wherein said steps are cyclically repeated.

17. The method as recited in claim 14 wherein said steps (a), (b), (c), (d), (e), (f), (g), (h), and (i) are cyclically repeated.

18. The method as recited in claim 14 wherein said steps (a), (b), (c), (g), (h), (i), (d), (e), and (f) are performed in repeated sequential order.

19. Apparatus, utilizing a reference voltage V, for providing a precise reference voltage xV comprising (a) a comparator having an input terminal and an output terminal;

(b) a first capacitor having a first terminal, and a second terminal coupled to said input terminal of said comparator;

(c) means for applying said reference voltage V to said first terminal of said first capacitor while said second terminal of said first capacitor is coupled to a point of reference potential;

(d) means for decoupling said second terminal from said point of reference potential;

(e) a voltage-to-current pulse converter having an output, and having an input coupled to said output terminal of said comparator;

(f) a storage capacitor coupled across said point of reference potential and said output of said converter;

(g) a buffer having an output, and having an input coupled to said output of said converter;

(h) a second capacitor having a first terminal, and a second terminal coupled to said input terminal of said comparator; and (i) means for applying said output of said buffer to said first terminal of said second capacitor, wherein the ratio of the value of said first capacitor to the value of said second capacitor is x.

20. Apparatus, utilizing a reference voltage V, for providing a precise reference voltage xV comprising (a) a comparator having an input terminal and an output terminal;

(b) a first capacitor having a first terminal, and a second terminal coupled to said input terminal of said comparator;

(c) means for applying said reference voltage V to said first terminal of said first capacitor while said second terminal of said first capacitor is coupled to a point of reference potential;

(d) means for decoupling said second terminal from said point of reference potential;

(e) a capacitive attenuator/memory coupled to said output terminal of said comparator;

(f) a voltage divider controlled by said capacitive attenuator/memory;

(g) a second capacitor having a first terminal, and a second terminal coupled to said input terminal of said comparator; and (h) means for applying an output of said voltage divider to said first terminal of said second capacitor, wherein the ratio of the value of said first capacitor to the value of said second capacitor is x.

21. Apparatus, utilizing a reference voltage V, for providing a precise reference voltage $V/2^n$ comprising (a) a comparator having an input terminal and an output terminal;

(b) a first capacitor having a first terminal, and a second terminal coupled to said input terminal of said comparator;

(c) means for applying said reference voltage V to said first terminal of said first capacitor while said second terminal of said first capacitor is coupled to a point of reference potential;

(d) means for decoupling said second terminal from said point of reference potential;

(e) a voltage-to-current pulse converter having an output, and having an input coupled to said output terminal of said comparator;

(f) a storage capacitor coupled across said point of reference potential and said output of said converter;

(g) a buffer having an output, and having an input coupled to said output of said converter;

(h) a second capacitor having a first terminal, and a second terminal coupled to said input terminal of said comparator; and (i) means for applying said output of said buffer to said first terminal of said second capacitor, wherein said first capacitor has a value of $(2^{n-1}+ \ldots +2^1+2^0)$ m farads, said second capacitor has a value of $(2^{2n-1}+ \ldots +2^n)$ m farads, n is a positive integer, and m is a positive constant.

22. The apparatus as recited in claim 21 wherein n=4, and said first capacitor and said second capacitor have values of capacitance in a ratio of 15:240.

23. The apparatus as recited in claim 22 wherein said second capacitor includes two capacitive banks having a ratio of 128:112.

24. The apparatus as recited in claim 23 further comprising (j) a second voltage-to-current pulse converter having an output, and having an input coupled to said output terminal of said comparator;

(k) a third voltage-to-current pulse converter having an output, and having an input coupled to said output terminal of said comparator;

(l) a second storage capacitor coupled across said point of reference potential and said output of said second converter;

(m) a third storage capacitor coupled across said point of reference potential and said output of said third converter;

(n) a second buffer having an output, and having an input coupled to said output of said second converter;

(o) a third buffer having an output, and having an input coupled to said output of said third converter;

(p) means for applying said output of said second buffer to said first terminal of said first capacitor and to one only of said capacitive banks; and (q) means for applying said output of said third buffer to said first terminal of said second capacitor.

25. The apparatus as recited in claim 24 wherein said first capacitor and said capacitive banks have values of 15, 112, 128 m farads, respectively.

26. The apparatus as recited in claim 25 further comprising a fourth capacitor having a value of 1 m farads coupled between said input of said comparator and, selectively, either a point of reference potential or a reference voltage $-V$.

27. Apparatus, utilizing a reference voltage V, for providing a precise reference voltage $V/2^n$ comprising (a) a comparator having an input terminal and an output terminal;

(b) a first capacitor having a first terminal, and a second terminal coupled to said input terminal of said comparator;

(c) means for applying said reference voltage V to said first terminal of said first capacitor while said second terminal of said first capacitor is coupled to a point of reference potential;

(d) means for decoupling said second terminal from said point of reference potential;

(e) a capacitive attenuator/memory having an input coupled to said output terminal of said comparator;

(f) a voltage divider controlled by said capacitive attenuator/memory;

(g) a second capacitor having a first terminal, and a second terminal coupled to said input terminal of said comparator; and (h) means for applying an output of said voltage divider to said first terminal of said second capacitor, wherein said first capacitor has a value of $(2^{n-1} + \ldots + 2^1 + 2^0)$ m farads, said second capacitor has a value of $(2^{2n-1} + \ldots + 2^n)$ m farads, n is a positive integer, and m is a positive constant.

28. The apparatus as recited in claim 27 wherein n=4, and said first capacitor and said second capacitor have values of capacitance in a ratio of 15:240.

29. The apparatus as recited in claim 28 wherein said second capacitor includes two capacitive banks having a ratio of 128:112.

30. The apparatus as recited in claim 29 further comprising (i) a second capacitive attenuator/memory having an output, and having an input coupled to said output terminal of said comparator;

(j) a third capacitive attenuator/memory having an output, and having an input coupled to said output terminal of said comparator;

(k) a second voltage divider controlled by said second capacitive attenuator/memory;

(l) a third voltage divider controlled by said third capacitive attenuator/memory;

(m) means for applying an output of said second voltage divider to said first terminal of said first capacitor and to one only of said capacitive banks; and (n) means for applying an output of said third voltage divider to said first terminal of said second capacitor.

31. The apparatus as recited in claim 30 wherein said first capacitor and said capacitive banks have values of 15, 112, 128 m farads, respectively.

32. The apparatus as recited in claim 31 further comprising a fourth capacitor having a value of 1 m farads coupled between said input of said comparator and, selectively, either a point of reference potential or a reference voltage $-V$.

* * * * *